United States Patent [19]

Yukawa

[11] Patent Number: 5,455,783
[45] Date of Patent: Oct. 3, 1995

[54] SUBSAMPLING FILTER COMPRISING TWO FILTERS IN SUCCESSION

[75] Inventor: Akira Yukawa, Tokyo, Japan

[73] Assignee: NEC Corporation, Tokyo, Japan

[21] Appl. No.: 3,619

[22] Filed: Jan. 13, 1993

[30] Foreign Application Priority Data

Jan. 13, 1992 [JP] Japan .................................. 4-003511

[51] Int. Cl.$^6$ .................................................. G06F 15/31
[52] U.S. Cl. ......................................................... 364/724.1
[58] Field of Search .......................... 364/724.01, 724.1, 364/701; 375/103; 341/61, 131

[56] References Cited

U.S. PATENT DOCUMENTS

| | | | |
|---|---|---|---|
| 4,588,979 | 5/1986 | Adams | 341/131 |
| 4,733,403 | 3/1988 | Simone | 375/103 |
| 4,972,357 | 11/1990 | Morel | 364/724.1 |
| 5,157,395 | 10/1992 | Del Signore et al. | 364/724.1 X |
| 5,191,334 | 3/1993 | Yasuda | 341/61 |
| 5,220,327 | 6/1993 | Abbiate et al. | 364/724.1 X |

OTHER PUBLICATIONS

Yukawa, Akira, "An Oversampling A–to–D Converter for VLSI Digital Codec's" *ICASSP*, Mar. 1985, 1400–1403.

*Primary Examiner*—Roy N. Envall, Jr.
*Assistant Examiner*—Chuong D. Ngo

[57] ABSTRACT

A subsampling filter for subsampling a filter input sequence of oversampled data at a predetermined subsampling ratio into a filter output sequence of eventually subsampling data, has a data holding unit for producing three successive data of the oversampled data as each of output patterns of a first output sequence. An input-stage filter subsamples the first output sequence at a subsampling ratio of one by two into a second output sequence of intermediately subsampled data. An output-stage filter subsamples the second output sequence into the filter output sequence. Each of the intermediately subsampled data has one of five values 0, plus 1, minus 1, plus 2, and minus 2. The output-stage filter includes a memory for memorizing filter coefficients determined by a transfer function of this filter, a scaler for calculating products of the filter coefficients and the intermediately subsampled data, and an adder for calculating an algebraic sum of each product and an intermediate sum which is an accumulated sum fed back from a register device of the output-stage filter for memorizing the algebraic sum as such an accumulated sum.

2 Claims, 2 Drawing Sheets

5,455,783

SUBSAMPLING FILTER COMPRISING TWO FILTERS IN SUCCESSION

BACKGROUND OF THE INVENTION

This invention relates to a subsampling or decimation filter for subsampling a filter input sequence of oversampled data into a filter output sequence of subsampled data. Such a subsampling filter is used as a digital signal processing device in converting into a device output sequence of a low sampling rate a device input sequence of data which are obtained by subjecting an analog signal to one-bit encoding at a high sampling rate by, for example, a delta-sigma modulator or to oversampling analog-to-digital conversion at an oversampling ratio by an oversampling analog-to-digital converter.

An oversampled data sequence generally includes much quantization noise in higher frequencies. For signal processing, transmission, and accumulation, the oversampled data sequence must be converted into a converted sequence of data sampled at a low sampling rate and having a high resolution. The subsampling filter is used in such a case and is usually a finite impulse response (FIR) filter.

A compact subsampling filter of a novel circuit configuration is described in a paper contributed by Akira Yukawa, the present inventor, and two others to the ICASSP (IEEE International Conference on Acoustics, Speech, and Signal Processing) Proceedings, March 1985, pages 1400 to 1403, under the title of "An Oversampling A-to-D Converter for VLSI Digital "Codec's". In the manner which will later be described more in detail, this subsampling filter comprises circuit elements which must be put into operation at an undesiredly high frequency. Furthermore, the subsampling filter is appreciably power consuming. It is possible to compose the subsampling filter with circuit elements which are operable at a lower frequency. This, however, results in an objectionably increased amount of hardware.

SUMMARY OF THE INVENTION

It is consequently an object of the present invention to provide a subsampling filter which is for subsampling an input sequence of oversampled data into an output sequence of subsampled data and in which most of circuit elements are operable at a lower frequency than an oversampling frequency used in oversampling an analog signal into the input sequence.

It is another object of this invention to provide a subsampling filter which is of the type described and which is simple in structure.

It is still another object of this invention to provide a subsampling filter which is of the type described and which is operable with a small power consumption.

Other objects of this invention will become clear as the description proceeds.

On describing the gist of this invention, it is possible to understand that a subsampling filter is for subsampling a filter input sequence of oversampled data at a predetermined subsampling ratio into a filter output sequence of eventually subsampled data.

In accordance with this invention, the above-understood subsampling filter comprises: (A) data holding means for holding three successive data of the oversampled data at a time as a held pattern to produce the held pattern from time to time as a first output sequence of output patterns; (B) an input-stage filter connected to the data holding means for subsampling the first output sequence at a subsampling ratio of one by two into a second output sequence of intermediately subsampled data; and (C) an output-stage filter connected to the input-stage filter for subsampling the second output sequence into the filter output sequence.

DESCRIPTION OF THE PREFERRED EMBODIMENT

Figure 1:
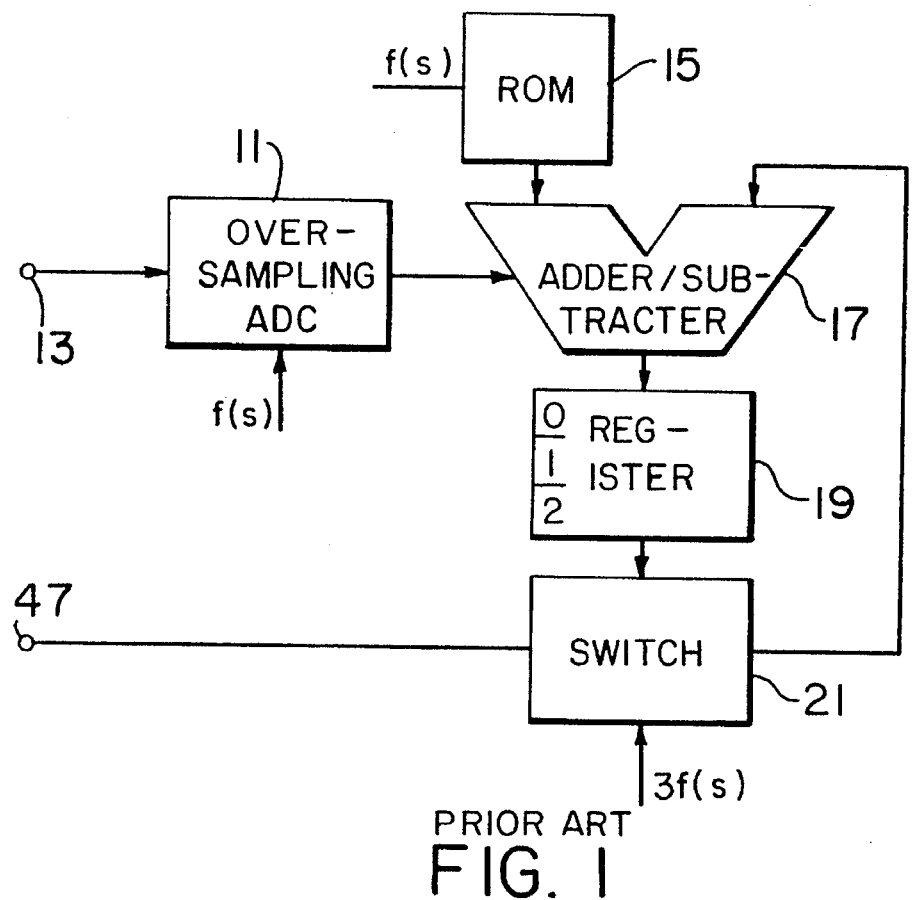
FIG. 1 shows in blocks a conventional subsampling filter together with an oversampling analog-to-digital converter.

Referring to FIG. 1, a conventional subsampling filter will first be described in order to facilitate an understanding of the present invention. The subsampling filter is described in the paper cited hereinabove.

An oversampling analog-to-digital converter (ADC) 11 is supplied with an analog signal $X(z)$ from a converter input terminal 13 and with an oversampling clock sequence which has an oversampling frequency $f(s)$ and is indicated by the reference symbol $f(s)$. Oversampling the analog signal into one-bit data, the oversampling analog-to-digital converter 11 produces a converter output sequence $Y(z)$ of oversampled data. When a second-order delta-sigma modulator is used as the oversampling analog-to-digital converter 11, the converter output sequence is represented by the following equation:

$$Y(z)=X(z)+(1-z^{-1})^2 Q(z), \qquad (1)$$

where $Q(z)$ represents quantization noise.

Supplied with the converter output sequence as a filter input sequence, the subsampling filter subsamples the filter input sequence into a filter output sequence of subsampled data at a predetermined subsampling ratio which is selected typically between one by sixteen and one by sixty-four. According to Equation (1), the quantization noise distributes in the filter input sequence as a second-order differential function of the frequency. In order to subsample the filter input sequence, the subsampling filter must have a third-order attenuation characteristic with an increase in the frequency.

It will be assumed that the subsampling filter should subsample the filter input sequence into the filter output sequence at a subsampling ratio of one by thirty-two. In this event, the subsampling filter should have a transfer function $H(z)$ given by the following equation:

$$H(z)=[(1+z^{-1}+z^{-2}+\ldots +z^{-31})/32]^3. \qquad (2)$$

When expanded, Equation (2) is represented by using ninety-four coefficients. The transfer function is therefore implemented with the subsampling filter made to have ninety-four taps (not shown). It is possible to identify these taps by zeroth through ninety-third tap numbers as zeroth through ninety-third taps. In each of oversampling periods, pertinent ones of the oversampled or one-bit data are multiplied at the zeroth through the ninety-third taps by using the ninety-four coefficients as zeroth through ninety-third filter coefficients.

In FIG. 1, the subsampling filter comprises a read-only memory (ROM) 15 for memorizing the filter coefficients and for producing the filter coefficients in the manner which will presently be described. An adder/subtracter 17 is supplied with each filter coefficient at a time and with an input intermediate sum as will shortly be described. Controlled by each oversampled or one-bit datum, the adder/subtracter 17 produces an output intermediate sum by adding the filter coefficient to the input intermediate sum and by subtracting the filter coefficient from the input intermediate sum when the oversampled datum represents a binary one value and a binary zero value, respectively. The output intermediate sum is stored in a register device 19 and is supplied back to the adder/subtracter 17 as the input intermediate sum through a switch device 21.

Inasmuch as it is assumed that the subsampling filter should produce the filter output sequence by subsampling the filter input sequence at the subsampling ratio of one by thirty-two, the subsampled data should be produced from the taps of the tap numbers which are different by thirty-two, such as the zeroth, the thirty-second, and the sixty-fourth taps. As a consequence, the adder/subtracter 17 should calculate an algebraic sum three times in each oversampling period in connection with a relevent one of the oversampled data. The register device 19 consequently comprises zeroth, first, and second registers indicated by 0, 1, and 2 within the block representative thereof. Accessed by an address signal variable at three times the oversampling frequency, the read-only memory 15 produces in each oversampling period three filter coefficients for the taps which are identified by the tap numbers exemplified above.

When the second-order delta-sigma modulator is used in providing an analog-to-digital converter system for use in, for example, digital audio use, an oversampling ratio of about 256 is necessary. If the low sampling rate should be 48 kHz, the oversampling analog-to-digital converter 11 must produce the oversampled data at a rate of 12,288 kHz. The adder/subtracter 17 must be operable at as high a frequency as about 37 MHz.

In the manner described heretobefore, the conventional subsampling filter is excellently compact. The subsampling filter must, however, comprise the adder/subtracter 17 which is operable at this high frequency. Difficulty is inevitable in designing such circuit elements. Furthermore, the subsampling filter is appreciably power consuming. It is possible to avoid use of the high frequency by using three sets of accumulators. This, however, results in an objectionable increase of hardware.

Figure 2:
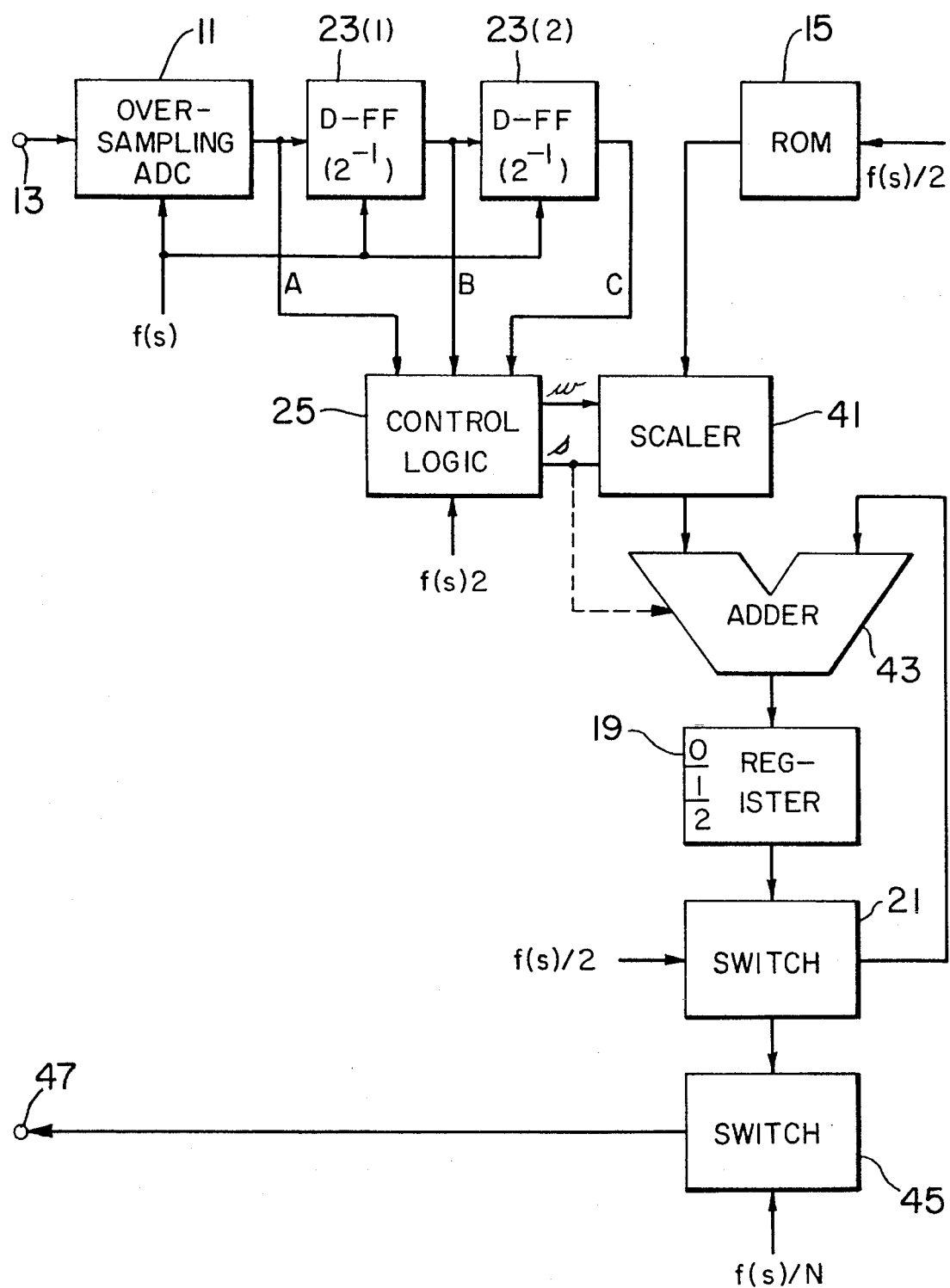
FIG. 2 shows in blocks a subsampling filter according to an embodiment of the instant invention together with an oversampling analog-to-digital converter.

Referring now to FIG. 2, the description will proceed to a subsampling filter according to a preferred embodiment of this invention. Similar parts are designated by like reference numerals and are similarly operable with likewise named signals.

A subsampling ratio of 1/N will be taken into consideration, where N represents a predetermined natural number, such as thirty-two. In this event, the subsampling filter subsamples the filter input sequence into the filter output sequence in two stages, first at a first subsampling ratio of one by two and subsequently at a second subsampling ratio of 2/N. The above-mentioned subsampled data are consequently referred to herein as eventually subsampled data.

In FIG. 2, the oversampling analog-to-digital converter 11 produces, like in FIG. 1, the converter output sequence as the filter input sequence of oversampled data, which will be designated by ..., R, S, T, U, V, W, ... for the time being. First and second D-type flip-flop (D-FF's) 23(1) and 23(2) are successively connected to the oversampling analog-to-digital converter 11 and supplied with the oversampling clock sequence to be operable as first and second delay elements, each giving the filter input sequence a delay time of one oversampling period indicated by $z^{-1}$. The oversampling analog-to-digital converter 11 and the first and the second delay elements 23 (suffixes omitted) therefore produce in a certain one of the oversampling periods the oversampled data T, S, and R as first through third output data A, B, and C. Two oversampling periods later, the oversampling analog-to-digital converter 11 and the delay elements 23 produce the oversampled data V, U, and T as the first through the third output data A to C.

It is now appreciated that the delay elements 23 serve in cooperation with its input terminal connected to the oversampling analog-to-digital converter 11 as a data holding arrangement for holding three successive or consecutive data of the oversampled data of the filter input sequence at a time. Before produced from the data holding arrangement (23), the three successive data represent a pattern of the binary one and/or zero values as a held pattern. The data holding arrangement produces the held pattern from time to time as a first output sequence of output patterns.

Connected to the data holding arrangement, a logic circuit 25 is supplied with the first output sequence. Controlled by a first frequency demultiplexed signal which is produced by frequency demultiplexing the oversampling clock sequence by two and is therefore indicated by a reference symbol f(s)/2, the logic circuit 25 produces a weighting signal and a sign signal. In the manner listed in Table below, the weighting signal represents three weights 0, 1, and 2, one weight w at a time. The sign signal indicates plus and minus signs, one sign s at a time. The plus and the minus signs are used in combination with the weights in the manner which will presently be described. In the Table, the output patterns are shown by the first through the third output data A to C. Incidentally, the first frequency demultiplexed signal defines a predetermined time period which is equal to twice the oversampling period.

TABLE

| A | 0 | 0 | 0 | 0 | 1 | 1 | 1 | 1 |
|---|---|---|---|---|---|---|---|---|
| B | 0 | 0 | 1 | 1 | 0 | 0 | 1 | 1 |
| C | 0 | 1 | 0 | 1 | 0 | 1 | 0 | 1 |
| w | 2 | 1 | 0 | 1 | 1 | 0 | 1 | 2 |
| s | − | − |   | + | − |   | + | + |

It will become clear as the description proceeds that the logic circuit 25 serves as an input-stage filter for subsampling the first output sequence at the first subsampling ratio into a second output sequence of intermediately subsampled data in accordance with the output patterns. A combination of the weight w and the sign s represents each of the intermediately subsampled data which are timed in the second output sequence by the first frequency demultiplexed signal.

The input-stage filter (25) has a first transfer function $H1(z)$ represented by the following equation:

$$H1(z) = (1 + 2z^{-1} + z^{-2})/2. \tag{3}$$

The Table serves as a truth table for Equation (3).

The first transfer function gives a second-order high frequency attenuation characteristic. The input-stage filter therefore less attenuates the quantization noise than a filter having the third-order attenuation characteristic like the conventional subsampling filter. The subsampling ratio is, however, only one by two. The input-stage filter consequently can give a sufficient attenuation to a frequency band which may be folded on a frequency band of the second output sequence.

Figure 3:
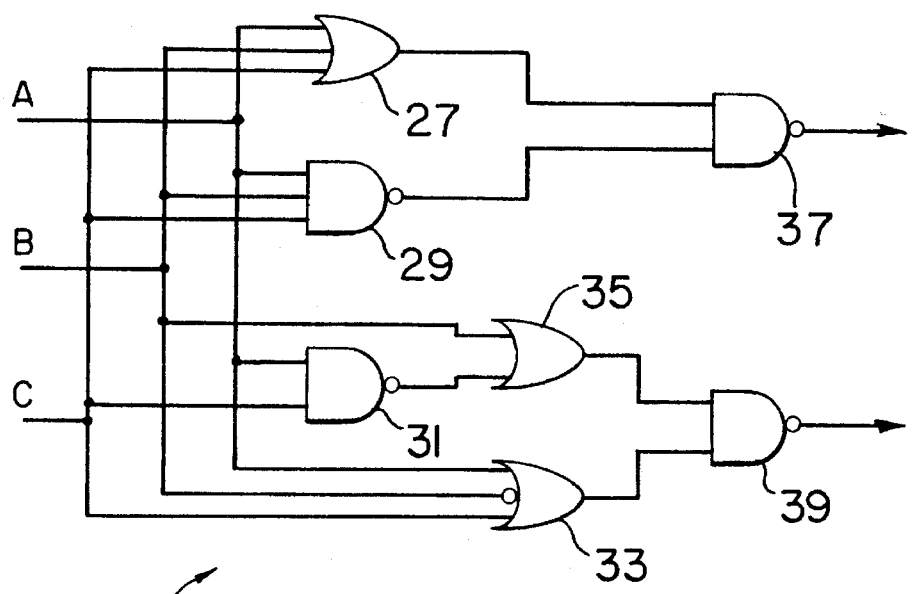
FIG. 3 is a partial circuit diagram of a logic circuit for use in the subsampling filter depicted in FIG. 2.

Turning to FIG. 3 during a short while, the logic circuit 25 comprises a first three-input OR gate 27 and a three-input NAND gate 29 supplied with the first through the third output data A to C to produce a first OR output signal and a first NAND output signal. A two-input NAND gate 31 is supplied with the first and the third output data A and C and produces a second NAND output signal. A second three-input OR gate 33 is supplied with the first output datum A, an inverted datum of the second output datum B, and the third output datum C to produce a second OR output signal. A two-input OR gate 35 is supplied with the second output datum B and the second NAND output signal to produce a third OR output signal.

A first output NAND gate 37 is supplied with the first OR output signal and the first NAND output signal and produces a shift signal which has the binary one value only when all of the first through the third output data A to C have either the binary zero value or the binary one value. Referring to the Table, it is understood that the shift signal corresponds to the weighting signal representative of the weight of minus or plus 2. A second output NAND gate 39 is supplied with the second and the third OR output signals to produce a clear signal which corresponds to the weighting signal for the weight 0.

Similarly, the logic circuit 25 produces a pass signal and the sign signal. The pass signal corresponds to the weighting signal representative of the weight of plus or minus 1.

Turning back to FIG. 2, the subsampling filter comprises an output-stage filter connected to the input-stage filter to subsample the second output sequence into the filter output sequence of eventually subsampled data at the second subsampling ratio mentioned before. Inasmuch as the predetermined natural number N is not small, the output-stage filter should have a second transfer function H2(z) which should have a sufficiently great high frequency attenuation and is represented by the following equation when the predetermined natural number N represents thirty-two in the manner assumed in the foregoing:

$$H2(z)=[(1+z^{-1}+z^{-2}+\ldots+z^{-15})/16]^3/2. \quad (4)$$

When expanded, Equation (4) is represented by using forty-six coefficients. For example, the coefficient for $z^0$ is equal to 1/4096. The coefficient for $z^{-1}$ is equal to 3/4096. The coefficient for $z^{-2}$ is equal to 6/4096. The coefficient for $z^{-3}$ is equal to 10/4096. The coefficient for $z^{-4}$ is equal to 15/4096. It is readily possible in this manner to calculate the coefficient whatever value the predetermined natural number N may have.

In the manner described in conjunction with FIG. 1, the second transfer function is implemented by making the output-stage filter have forty-six taps (not shown). It is possible to identify these taps by zeroth through forty-fifth tap numbers as zeroth through forty-fifth taps. In each predetermined time period mentioned above, the intermediately subsampled data are multiplied at the zeroth through the forty-fifth taps by the zeroth through the forty-fifth coefficients which are used as zeroth through forty-fifth filter coefficients. Depending on the circumstances, such filter coefficients will be referred to as predetermined filter coefficients.

In the output-stage filter, the read-only memory 15 memorizes the zeroth through the forty-fifth filter coefficients and furthermore two zeros as forty-sixth and forty-seventh filter coefficients. Accessed by an address signal which is variable at the predetermined time period and is therefore indicated by the reference symbol f(s)/2, the read-only memory 15 produces as read-out coefficients three filter coefficients defined among the zeroth through the forty-seventh filter coefficients by the tap numbers which are different from one another by sixteen in correspondence to the second subsampling ratio mentioned before.

A scaler 41 is connected to the read-only memory 15 and to the logic circuit 25 and receives the read-out filter coefficients and the weight w together with the sign s. Each weight together with its sign will be called a scaler input datum. In the manner listed in the Table, each scaler input datum has one of five values 0, plus 1, minus 1, plus 2, and minus 2 at a time. In other words, the scaler 41 receives from the logic circuit 25 the intermediately subsampled data as the scaler input data.

The scaler 41 multiplies the read-out filter coefficients by each scaler input datum to produce scaler output products. In practice, the scaler 41 clears the read-out filter coefficients when the weighting signal is the clear signal. The scaler 41 causes the read-out filter coefficients to pass therethrough with no modification when the weighting signal is the pass signal. The scaler 41 gives a one-bit leftward shift to the read-out filter coefficients when the weighting signal is the shift signal. In this manner, the scaler 41 is very simply operable. The scaler output products are given the signs unless the read-out filter coefficients are cleared.

An adder 43 is connected to the scaler 41 to receive each coaler output product at a time and is supplied with an input intermediate sum in the manner which will presently be described. The adder 43 calculates a sum of the scaler output product and the input intermediate sum as an output intermediate sum with the sign of the scaler output product taken into consideration.

Connected to the adder 43 and comprising the zeroth through the second register 0 to 2 in the manner described in connection with FIG. 1, the register device 19 memorizes the output intermediate sum as an accumulated sum and produces the accumulated sum. On so memorizing the accumulated sum, the register device 19 is cleared once in each clearing interval of time which is 3N/2 oversampling periods long.

The switch device 21 is connected to the register device 19 and to the adder 43 and is controlled by a switch control signal which defines the predetermined time period and is therefore indicated by the reference symbol f(s)/2. The switch device 21 delivers the accumulated sum from the register device 19 to the adder 41 for use as the input intermediate sum. When the register device 19 is cleared, another switch device 45 supplies a filter output terminal 47 with the accumulated sums which are cleared from the zeroth through the second registers 0 to 2 of the register device. The later-mentioned switch device 45 is controlled by a second frequency demultiplexed signal which is produced by frequency demultiplexing the oversampling clock sequence by the predetermined natural number N and is therefore indicated by a reference symbol f(s)/N.

Operation of the scaler 41, the adder 43, the register device 19, and the switch device 21 will be described in greater detail with regard to first and second scaler input data D1 and D2. First, the scaler 41 multiplies by the first scaler input datum D1 the zeroth filter coefficient to produce a first product P1, the sixteenth filter coefficient to produce a second product P2, and the thirty-second filter coefficient to produce a third product P3. Under the circumstances, the adder 43 calculates a first sum S1 of the first product P1 and the accumulated sum produced from the zeroth register 0 as an input intermediate sum, a second sum S2 of the second product P2 and the accumulated sum produced from the first register 1, and a third sum S3 of the third product P3 and the accumulated sum produced from the second register 2. In the meantime, the first sum S1 is substituted in the zeroth register 0 for the accumulated sum used in calculating the first sum. In this manner, the register device 19 is updated to memorize new accumulated sums.

Next, the scaler 41 multiplies by the second scaler input datum D2 the first filter coefficient to produce a fourth product P4, the seventeenth filter coefficient to produce a fifth product P5, and the thirty-third filter coefficient to produce a sixth product P6. The adder 43 calculates a fourth sum S4 of the fourth product P4 and the first sum S1 stored in the zeroth register 0 as the new accumulated sum, a fifth sum S5 of the fifth product P5 and the accumulated sum afresh stored in the first register 1, and a sixth sum S6 of the sixth product P6 and the accumulated sum substituted in the second register 2 for the accumulated sum used in calculating the third sum. Operation proceeds in this manner until a forty-eighth sum is calculated by using the forty-seventh filter coefficient and is substituted in the register device 19 for the accumulated sum used in calculating the forty-eighth sum. At this moment, the second-mentioned switch device 45 delivers the accumulated sums from the registers 0 through 2 to the filter output terminal 47 as three eventually subsampled data. The register device 19 is cleared.

Reviewing FIG. 2, it is possible to make the scaler 41 calculate the products of the predetermined filter coefficients and the weights with no regard to the signs. In this event, an adder/subtracter should be used in place of the adder 43 and be controlled by the sign signal through a dashed-line signal lead to make the adder/subtracter subtract the scaler output product from the input intermediate sum when the sign signal indicates the minus sign.

It is furthermore understood that each filter coefficient is represented by eight bits when the predetermined natural number is equal to thirty-two. This is two bits less than each filter coefficent used in the conventional subsampling filter. In addition, the adder 43 or the adder/subtracter is operable at twice slower rate than the adder/subtracter 17 described in connection with FIG. 1. As a result, it is possible to implement the subsampling filter of this invention as a complementary metal-oxide-semiconductor (CMOS) integrated circuit which is operable with a reduced power consumption.

While this invention has thus far been described in specific conjunction with a single preferred embodiment thereof and a few modifications, it will now be readily possible for one skilled in the art to carry this invention into effect in various other manners. For example, it is possible to use a combination of a counter and a logic circuit in place of the read-only memory 15. If desired, the output-stage filter may be structured in accordance with FIG. 1 with a half of the predetermined subsampling ratio used.

What is claimed is:

1. A subsampling filter for performing subsampling operation on oversampled one-bit data, comprising:

data holding means for temporarily holding three successive one-bit data of said oversampled one-bit data;

control logic means, coupled to said data holding means, for producing a control signal corresponding to a pattern of said three successive one-bit data;

memory means for storing a plurality of filter coefficients;

scaler means, coupled to said control logic means and said memory means, for multiplying filter coefficients read out from said memory means in correspondence with said control signal and for producing scaler products; and accumulating means, coupled to said scaler means, for accumulating each of said products to produce output data, wherein said control signal is variable and is selected from the group consisting of minus 2, minus 1, 0, plus 1 and plus 2 in accordance with said pattern of said three successive one-bit data held by said data holding means.

2. A subsampling filter for performing subsampling operation on oversampled one-bit data, comprising:

data holding means for temporarily holding three successive one-bit data of said oversampled one-bit data;

control logic means, coupled to said data holding means, for producing a control signal corresponding to a pattern of said three successive one-bit data;

memory means for storing a plurality of filter coefficients;

scaler means, coupled to said control logic means and said memory means, for multiplying filter coefficients read out from said memory means in correspondence with said control signal and for producing scaler products; and accumulating means, coupled to said scaler means, for accumulating each of said products to produce output data, wherein said control signal is one of a clear signal, a pass signal and a shift signal, said scaler means clearing said filter coefficients when said control signal is the clear signal, passing said filter coefficients when said control signal is the pass signal, and shifting said filter coefficients by one bit when said control signal is the shift signal.

* * * * *